(12) United States Patent
Hatae et al.

(10) Patent No.: US 7,649,482 B2
(45) Date of Patent: Jan. 19, 2010

(54) SIGNAL MODULATION METHOD, SIGNAL MODULATION APPARATUS, ELECTRONIC DEVICE, AND COMPUTER PROGRAM PRODUCT

(75) Inventors: Kazuhiko Hatae, Kawasaki (JP); Yasuo Ohtomo, Kawasaki (JP); Masashi Sato, Kawasaki (JP); Yutaka Awata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/183,536

(22) Filed: Jul. 31, 2008

(65) Prior Publication Data

US 2009/0085786 A1 Apr. 2, 2009

(30) Foreign Application Priority Data

Sep. 28, 2007 (JP) ............................. 2007-255195

(51) Int. Cl.
*H03M 3/00* (2006.01)
(52) U.S. Cl. ....................................... 341/143; 341/155
(58) Field of Classification Search ................. 341/143, 341/155, 172
See application file for complete search history.

(56) References Cited

U.S. PATENT DOCUMENTS 6,396,428 B1 * 5/2002 Cheng ......................... 341/143
7,126,517 B2 10/2006 Suzuki et al.
7,136,006 B2 * 11/2006 Koh et al. ................... 341/172
7,317,904 B2 * 1/2008 Matsushita et al. ....... 455/232.1
7,423,567 B2 * 9/2008 Melanson .................... 341/143

FOREIGN PATENT DOCUMENTS

| JP | 7-007435 A | 1/1995 |
| JP | 2002-502565 A | 1/2002 |
| JP | 2002-314425 A | 10/2002 |
| JP | 2006-042315 A | 2/2006 |
| WO | 98-54840 A3 | 12/1998 |

* cited by examiner

*Primary Examiner*—Peguy JeanPierre
(74) *Attorney, Agent, or Firm*—Westerman, Hattori, Daniels & Adrian, LLP

(57) ABSTRACT

A signal modulation method by an electronic device which includes a minimal reducing unit that minimally reduces an integrated signal returned to an adder from an integrator.

The signal modulation method includes generating an added signal with the adder. The signal modulation method further includes generating a new integrated signal with the integrator by returning a previously self-generated and stored integrated signal to the adder, and by integrating the added signal generated by the adder.

The signal modulation method further includes generating a new quantization signal with a quantizer by quantizing the new integrated signal generated by the integrator.

8 Claims, 6 Drawing Sheets

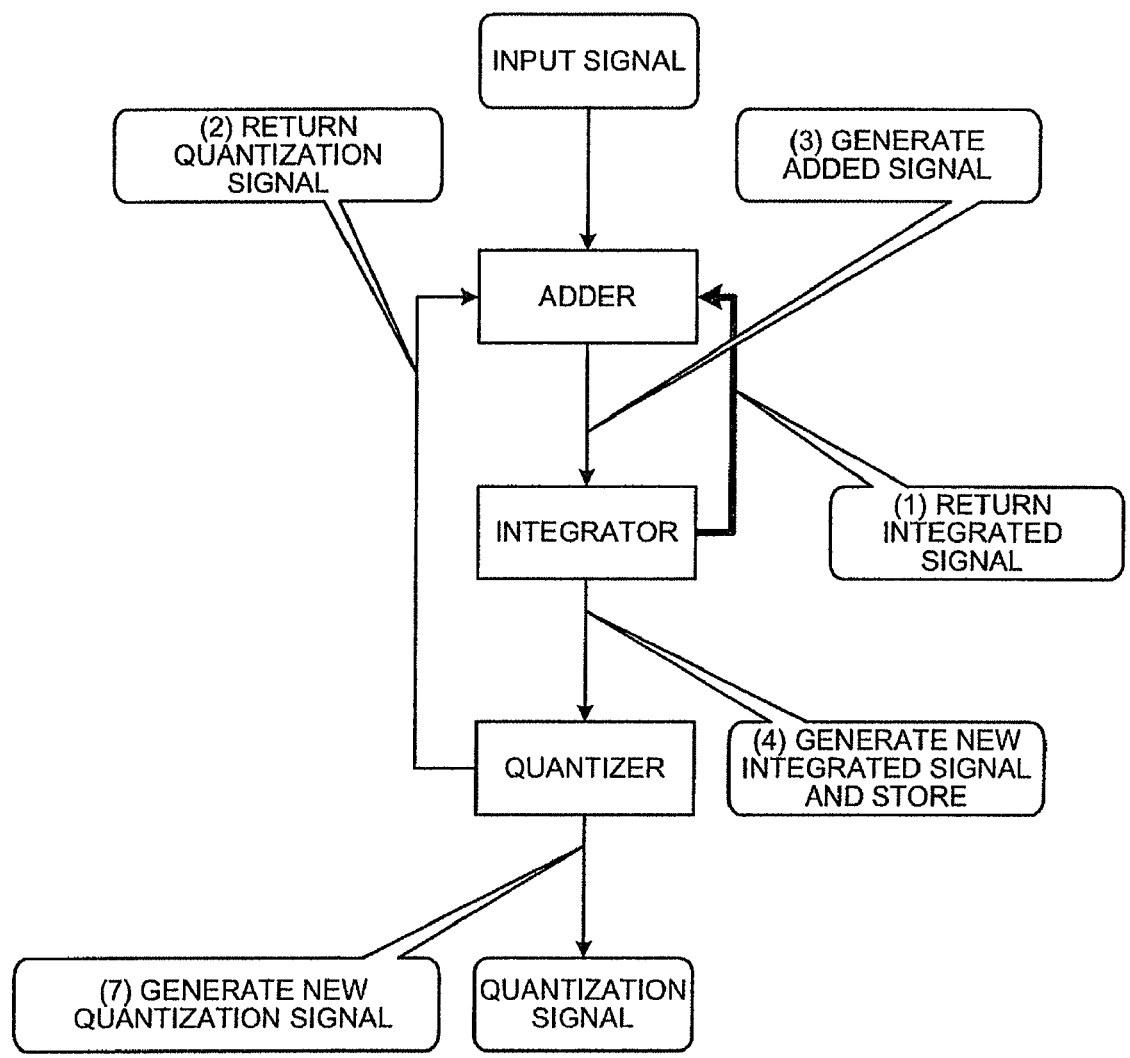

SIGNAL MODULATION METHOD, SIGNAL MODULATION APPARATUS, ELECTRONIC DEVICE, AND COMPUTER PROGRAM PRODUCT

BACKGROUND OF THE INVENTION

1. Field of the Invention

The present invention relates to a signal modulation method, a signal modulation apparatus, an electronic device, and a computer program product.

2. Description of the Related Art

Signal modulation apparatuses (sigma-delta modulation apparatus and delta-sigma modulation apparatus) that modulate an input signal, to carry out an analog-digital conversion and a digital-analog conversion have been widely applied to electronic devices such as audio equipment, communication equipment (for example, audio coder-decoder (CODEC) for mobile terminals), and measuring equipment that require highly accurate signal processing. Related technology has been disclosed in Japanese Patent Application Laid-open No. 2002-502565, Japanese Patent Application Laid-open No. H07-7435, Japanese Patent Application Laid-open No. 2002-314425, and Japanese Patent Application Laid-open No. 2006-42315.

A related-art signal modulation apparatus will now be specifically explained with reference to FIG. 7. FIG. 7 is a schematic explanatory diagram of the related-art signal modulation apparatus. The related-art signal modulation apparatus that includes an adder, an integrator, and a quantizer (comparator), and that modulates an input signal to a quantization signal will be explained.

On receiving the input signal, the integrator of the related-art signal modulation apparatus returns a previously self-generated and stored integrated signal to the adder (see (1) in FIG. 7), and the quantizer of the related-art signal modulation apparatus returns a previously self-generated quantization signal to the adder (see (2) in FIG. 7).

The adder of the related-art signal modulation apparatus generates an added signal, by subtracting the quantization signal returned by the quantizer from the input signal, and adding the integrated signal returned by the integrator thereto (see (3) in FIG. 7).

The integrator of the related-art signal modulation apparatus generates a new integrated signal by integrating the added signal generated by the adder, and stores the generated new integrated signal therein (see (4) in FIG. 7).

The quantizer of the related-art signal modulation apparatus generates a new quantization signal by quantizing the new integrated signal generated by the integrator (see (5) in FIG. 7).

In the related art, there is a problem that output noise generated by receiving a silent signal cannot be reduced.

In other words, with the audio equipment and the audio CODEC that the signal modulation apparatus is applied thereto, an improvement on the signal to noise ratio (SN ratio) of the signal modulation apparatus, and a reduction of noise when the silent signal is received, are required to improve the quality of actual sound.

However, in the related art that returns the integrated signal to the adder to improve the SN ratio of the signal modulation apparatus, when a silent signal is received after an audible signal is received as an input signal, the integrated signal generated when the audible signal is received, is added to the silent signal. Therefore, an audible quantization signal is generated, thereby occasionally generating noise as a consequence. In the related art, even if the silent signal is received, the integrated signal generated when the audible signal is received, is repeatedly returned to the adder without being attenuated. Accordingly, noise is sometimes generated, even if the silent signal is received.

For example, with the related art that improves quality of actual sound by adding a random signal made of short bits to the input signal, as disclosed in Japanese Patent Application Laid-open No. 2002-502565 and Japanese Patent Application Laid-open No. H07-7435, not only the installation is difficult, but noise is sometimes generated, even if the random signal receives the silent signal.

SUMMARY

It is an object of the present invention to at least partially solve the problems in the conventional technology.

According to an aspect of the present invention, a signal modulation method by an electronic device including a quantizer, an integrator, and an adder, includes generating an added signal with the adder by subtracting a quantization signal returned by the quantizer from an input signal and by adding an integrated signal returned by the integrator to the input signal; generating a new integrated signal with the integrator by returning a previously self-generated and stored integrated signal to the adder and by integrating the added signal generated by the adder; generating a new quantization signal with a quantizer by quantizing the new integrated signal generated by the integrator; and minimally reducing the integrated signal returned to the adder from the integrator.

According to another aspect of the present invention, a signal modulation apparatus modulates an input signal to a quantization signal. The signal modulation apparatus includes a quantizer; an integrator; an adder that generates an added signal by subtracting the quantization signal returned by the quantizer from the input signal, and by adding an integrated signal returned by the integrator to the input signal; and a minimal reducing unit. The integrator returns a previously self-generated and stored integrated signal to the adder, generates a new integrated signal by integrating the added signal generated by the adder, and stores therein the new integrated signal generated. The quantizer returns a previously self-generated quantization signal to the adder, and generates a new quantization signal by quantizing the new integrated signal generated by the integrator. The minimal reducing unit minimally reduces the integrated signal returned to the adder from the integrator.

According to still another aspect of the present invention, an electronic device modulates an input signal to a quantization signal. The electronic device includes a quantizer; an integrator; an adder that generates an added signal by subtracting the quantization signal returned by the quantizer from the input signal, and by adding an integrated signal returned by the integrator to the input signal; and a minimal reducing unit. The integrator returns a previously self-generated and stored integrated signal to the adder, generates a new integrated signal by integrating the added signal generated by the adder, and stores therein the new integrated signal generated, the quantizer returns a previously self-generated quantization signal to the adder, and generates a new quantization signal by quantizing the new integrated signal generated by the integrator, and the minimal reducing unit minimally reduces the integrated signal returned to the adder from the integrator.

According to still another aspect of the present invention, a computer program product having a computer readable medium including programmed instructions that implement the above method on a computer.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 7 is a schematic explanatory diagram of a related-art signal modulation apparatus.

DETAILED DESCRIPTION OF THE PREFERRED EMBODIMENTS

Exemplary embodiments of a signal modulation method, a signal modulation apparatus, an electronic device, and a signal modulation program according to the present invention will be described in detail below with reference to the accompanying drawings.

In a first embodiment, a schematic and characteristics of a signal modulation apparatus, a configuration of the signal modulation apparatus, a processing flow of the signal modulation apparatus according to the first embodiment will be explained sequentially, followed by advantages of the first embodiment in the end. In the first embodiment, a signal modulation apparatus (for example, sigma-delta modulation apparatus) in which the invention is applied, and that modulates an input signal will be explained.

Figure 1:
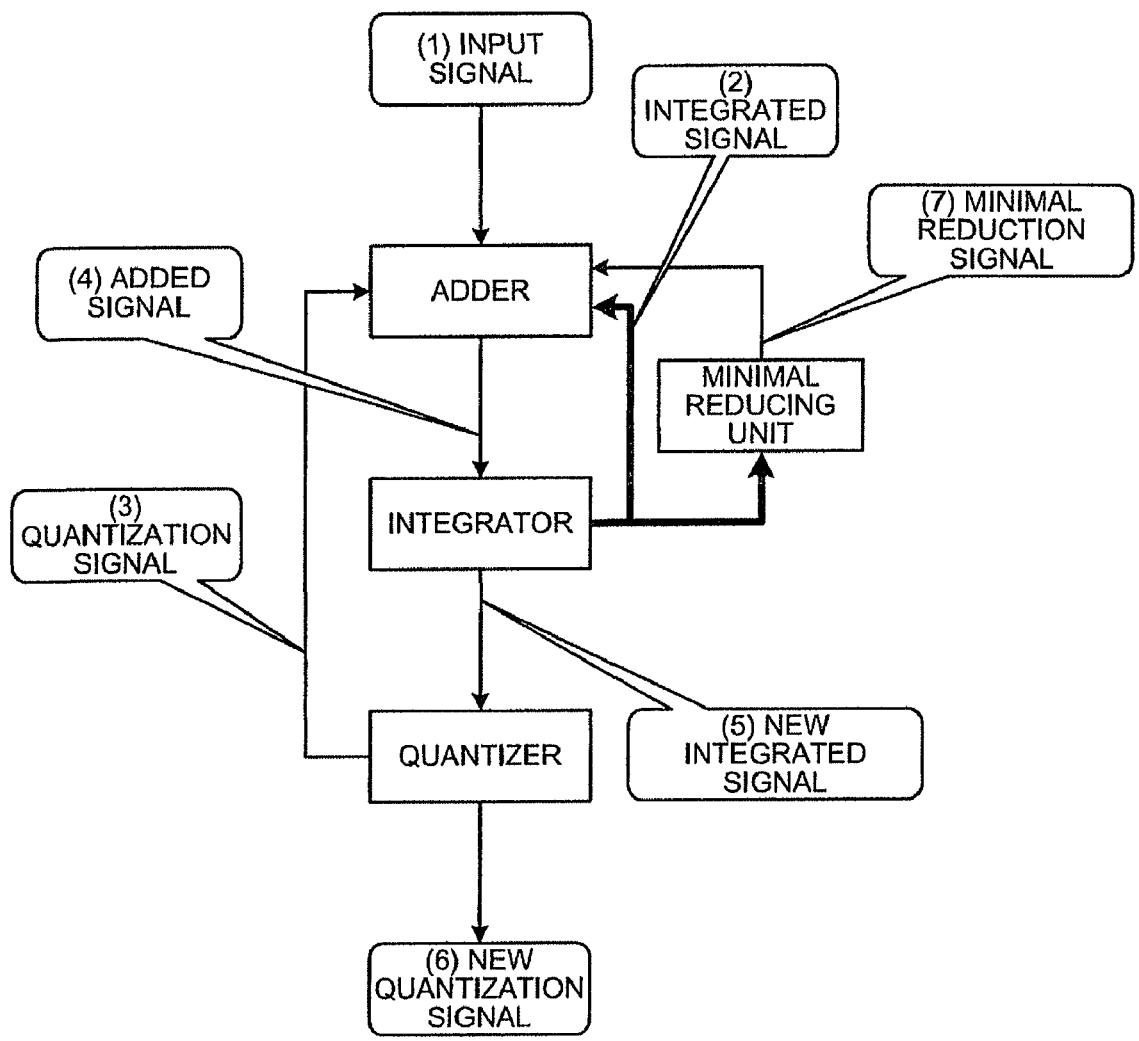
FIG. 1 is a schematic characteristic explanatory diagram of a signal modulation apparatus according to a first embodiment of the present invention.

First, the schematic and characteristics of the signal modulation apparatus according to the first embodiment are explained with reference to FIG. 1. FIG. 1 is a schematic characteristic explanatory diagram of the signal modulation apparatus according to the first embodiment.

The signal modulation apparatus according to the first embodiment includes an adder that generates an added signal, an integrator that integrates the added signal, and a quantizer that quantizes an integrated signal. The schematic of the signal modulation apparatus according to the first embodiment is to modulate an input signal to a quantization signal. The signal modulation apparatus according to the first embodiment also includes a minimal reducing unit between the integrator and the adder. The main characteristic of the signal modulation apparatus according to the first embodiment is to minimally reduce the integrated signal returned to the adder from the integrator, by the minimal reducing unit. In this manner, the signal modulation apparatus according to the first embodiment can reduce output noise generated by receiving a silent signal.

More specifically, as shown in FIG. 1, the signal modulation apparatus according to the first embodiment, on receiving an input signal (see (1) in FIG. 1), generates an added signal (see (4) in FIG. 1) by using an integrated signal (see (2) in FIG. 1) returned by the integrator, and a quantization signal (see (3) in FIG. 1) returned by the quantizer. The signal modulation apparatus according to the first embodiment then generates a new integrated signal (see (5) in FIG. 1) by integrating the added signal, and generates a new quantization signal (see (6) in FIG. 1) by quantizing the new integrated signal.

At this time, the minimal reducing unit of the signal modulation apparatus according to the first embodiment generates a minimal reduction signal (see (7) in FIG. 1) that minimally reduces the integrated signal from the integrated signal returned by the integrator, and minimally reduces the integrated signal returned to the adder from the integrator.

In this manner, the signal modulation apparatus according to the first embodiment, as the main characteristic, can reduce the output noise generated by receiving the silent signal, by minimally reducing the integrated signal returned to the adder from the integrator, by the minimal reducing unit.

Figure 2:
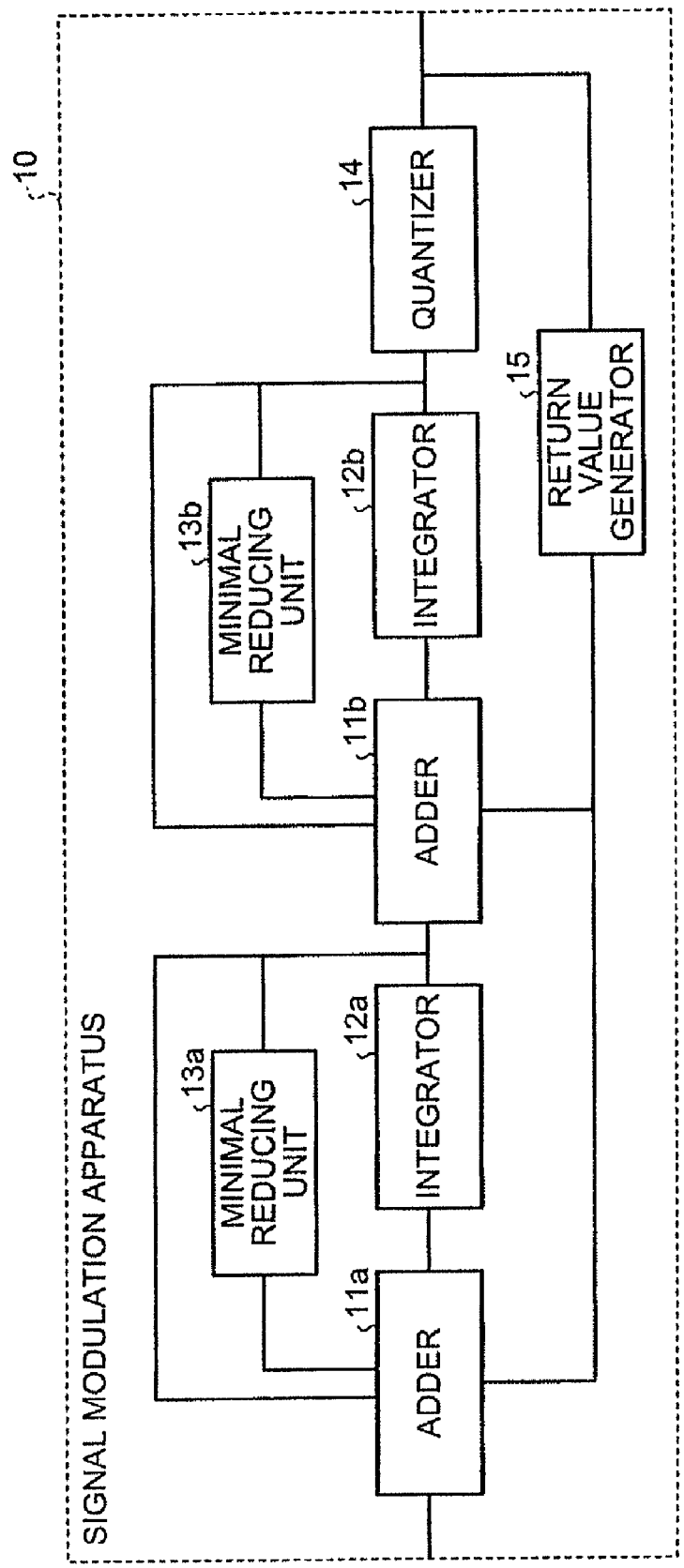
FIG. 2 is a block diagram of the signal modulation apparatus showing the configuration thereof.

A configuration of a signal modulation apparatus 10 will now be explained with reference to FIG. 2. FIG. 2 is a block diagram of the configuration of the signal modulation apparatus. As shown in FIG. 2, the signal modulation apparatus 10 includes adders 11a and 11b, integrators 12a and 12b, minimal reducing units 13a and 13b, a quantizer 14, and a return value generator 15.

The adders 11a and 11b generate the added signals by subtracting the quantization signal returned by the quantizer 14 from the input signals, and by adding the integrated signal returned by the integrators 12a and 12b to the input signals.

More specifically, the adder 11a generates a first added signal by subtracting the quantization signal returned by the quantizer 14 and a first minimal reduction signal generated by the minimal reducing unit 13a, from the input signal input from outside of the signal modulation apparatus 10, and by adding a first integrated signal returned from the integrator 12a to the input signal.

The adder 11b generates a second added signal by subtracting the quantization signal returned by the quantizer 14 and a second minimal reduction signal generated by the minimal reducing unit 13b, from the new first integrated signal generated by the integrator 12a, and by adding a second integrated signal returned from the integrator 12b to the new first integrated signal.

The integrators 12a and 12b return the previously self-generated and stored integrated signal to the adders 11a and 11b, generate a new integrated signal by integrating the added signal generated by the adders 11a and 11b, and store the generated new integrated signal therein.

More specifically, the integrator 12a returns the previously self-generated and stored first integrated signal to the adder 11a and the minimal reducing unit 13a. The integrator 12a then generates a new first integrated signal by integrating the first added signal generated by the adder 11a, and stores the generated new first integrated signal therein.

The integrator 12b returns the self-generated and stored second integrated signal to the adder 11b and the minimal reducing unit 13b. The integrator 12b then generates a new second integrated signal by integrating the second added signal generated by the adder 11b, and stores the generated new second integrated signal therein.

The minimal reducing units 13a and 13b minimally reduce the integrated signals returned to the adders 11a and 11b from the integrators 12a and 12b.

More specifically, on receiving the first integrated signal returned from the integrator 12a, the minimal reducing unit 13a multiplies a first coefficient by the first integrated signal, and generates a first minimal reduction signal that minimally reduces the first integrated signal.

On receiving the second integrated signal returned from the integrator 12b, the minimal reducing unit 13b multiplies a second coefficient by the second integrated signal, and generates a second minimal reduction signal that minimally reduces the second integrated signal.

The first coefficient and the second coefficient will now be explained in detail below. Symbol "z" indicates a variable. Symbol "Q" is a level value of quantization noise generated when the integrated signal is quantized by the quantizer 14, as well as a real number. Symbol "*" indicates multiplication. Symbol "≅" (see Formula (3) and Formula (4)) means approximately equal to.

A transfer function of the signal modulation apparatus that includes the adders 11a and 11b, the integrators 12a and 12b, the quantizer 14, and the return value generator 15, in other words, a so-called general secondary signal modulation apparatus, may be represented by Formula (1):

$$\text{Output} = \underbrace{z^{-2}}_{\text{STF}} * \text{Input} + \underbrace{(1-z^{-1})^2}_{\text{NTF}} * Q \quad (1)$$

Input is a level value of the input signal, and Output is a level value of the quantization signal. A signal transfer function (STF) is a transfer function of the signal, and a noise transfer function (NTF) is a transfer coefficient of noise.

In the signal modulation apparatus 10 according to the first embodiment, a transfer function of the signal modulation apparatus 10 according to the first embodiment is represented by the following formula (2). In this formula, a first coefficient multiplied by the first integrated signal, by the minimal reducing unit 13a, is represented by α, and a second coefficient multiplied by the second integrated signal, by the minimal reducing unit 13b, is represented by β.

$$\text{Output} = \underbrace{\frac{z^{-2}}{1 + (\alpha+\beta)z^{-1} + (\alpha-\beta+\alpha\beta)z^{-2}}}_{\text{STF}} * \text{Input} \quad (2)$$
$$+ \underbrace{\frac{1 - (2-\alpha-\beta)z^{-1} + (1-\alpha-\beta+\alpha\beta)z^{-2}}{1 + (\alpha+\beta)z^{-1} + (\alpha-\beta+\alpha\beta)z^{-2}}}_{\text{NTF}} * Q$$

When the first coefficient α and the second coefficient β are assumed to satisfy the following formula (3) and the formula (4) at the same time, the STF of the signal modulation apparatus 10 according to the first embodiment becomes equal to the STF of the general secondary signal modulation apparatus.

$$\alpha + \beta \cong 0 \quad (3)$$

$$\alpha - \beta + \alpha\beta \cong 0 \quad (4)$$

The NTF of the signal modulation apparatus 10 according to the first embodiment may be modified to the following formula (5). When the first coefficient α and the second coefficient β satisfy Formula (3) and Formula (4) at the same time in the following formula (5), the NTF of the signal modulation apparatus 10 according to the first embodiment may be represented by the following formula (6).

$$NTF = \frac{1 - 2(2-\alpha-\beta)z^{-1} + (1-\alpha-\beta+\alpha\beta)z^{-2}}{1 + (\alpha+\beta)z^{-1} + (\alpha-\beta+\alpha\beta)z^{-2}} \quad (5)$$
$$= \frac{1 - \{2 - (\alpha+b)\}z^{-1} + \{1 - 2\alpha + (a-\beta+\alpha\beta)\}z^{-2}}{1 + (\alpha+\beta)z^{-1} + (\alpha-\beta+\alpha\beta)z^{-2}} * Q$$

$$NTF = \frac{1 - 2z^{-1} + z^{-2} - 2\alpha z^{-2}}{1} = (1-z^{-1})^2 - 2\alpha z^{-2} \quad (6)$$

In other words, the signal modulation apparatus 10 according to the first embodiment does not affect the level value of the Input, when the Input is an audible signal. When the Input is a silent signal, the signal modulation apparatus 10 according to the first embodiment may reduce the integrated signal returned to the adder 11a from the integrator 12a by α, and may reduce the integrated signal returned to the adder 11b from the integrator 12b by β.

For example, the signal modulation apparatus 10 according to the first embodiment, when "α" and "β" are 2 to the minus 16th power, can reduce the integrated signal returned to the adder 11a from the integrator 12a by a value multiplied by 2 to the minus 16th power, every time the silent signal is received. As a result, the quantization noise can be reduced by a value, z−2 (this represents an index of −2 with respect to a base, z) is multiplied by 2 to the minus 15th power, than the general secondary signal modulation apparatus.

The quantizer 14 generates a new quantization signal by returning the previously self-generated quantization signal to the adders 11a and 11b, and quantizing the new integrated signal generated by the integrator 12b. More specifically, the quantizer 14 returns the previously self-generated quantization signal to the adders 11a and 11b via the return value generator 15. The quantizer 14 then generates a new quantization signal by quantizing the new integrated signal generated by the integrator 12b, outputs the quantization signal to outside of the signal modulation apparatus 10, and stores the generated new quantization signal therein.

The return value generator 15 converts the quantization signal returned by the quantizer 14. More specifically, the return value generator 15 converts the quantization signal returned by the quantizer 14, in a form of signal to be subtracted from the input signal, in the adder 11a or the adder 11b, respectively. For example, when the input signal input into the adder 11a is set to 16 bits, and the quantization signal returned by the quantizer 14 is set to 1 bit, the return value generator 15 converts the quantization signal to 16 bits.

Figure 3:
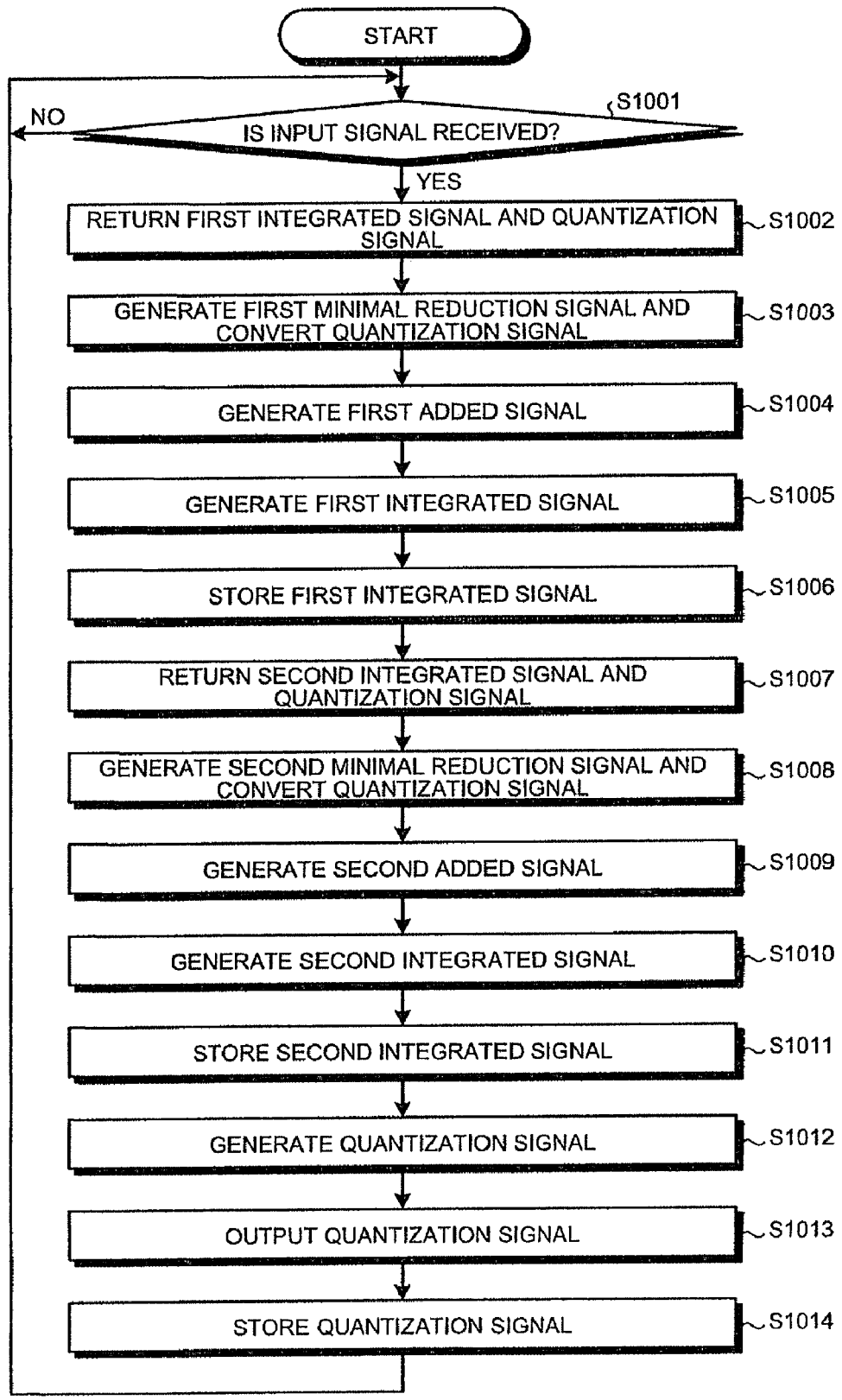
FIG. 3 is a flowchart of a processing flow of the signal modulation apparatus.

A processing flow of the signal modulation apparatus 10 will now be explained with reference to FIG. 3. FIG. 3 is a flowchart of the processing flow of the signal modulation apparatus. The processing to be explained below is repeatedly executed while the signal modulation apparatus 10 is activated, and will be finished when the signal modulation apparatus 10 stops activating.

As shown in FIG. 3, on receiving an input signal input from outside (Yes at step S1001), the signal modulation apparatus 10 returns a first integrated signal and a quantization signal (step S1002). More specifically, the integrator 12a returns the previously self-generated and stored first integrated signal to the adder 11a and the minimal reducing unit 13a, and the quantizer 14 returns the previously self-generated and stored quantization signal to the adder 11*a*.

The signal modulation apparatus 10 generates a first minimal reduction signal and coverts the quantization signal (step S1003). More specifically, the minimal reducing unit 13*a* generates the first minimal reduction signal, and the return value generator 15 converts the quantization signal in a form to be subtracted in the adder 11*a*.

The signal modulation apparatus 10 generates a first added signal (step S1004). More specifically, the adder 11*a* generates the first added signal by subtracting the quantization signal returned by the quantizer 14 and the first minimal reduction signal generated by the minimal reducing unit 13*a*, from the input signal, and by adding the first integrated signal returned from the integrator 12*a* to the input signal.

The signal modulation apparatus 10 generates a first integrated signal (step S1005), and stores the first integrated signal therein (step S1006). More specifically, the integrator 12*a* generates a new first integrated signal by integrating the first added signal, and stores the generated new first integrated signal therein.

The signal modulation apparatus 10 returns a second integrated signal and the quantization signal (step S1007). More specifically, the integrator 12*b* returns the previously self-generated and stored second integrated signal to the adder 11*b* and the minimal reducing unit 13*b*. The quantizer 14 returns the previously self-generated and stored quantization signal to the adder 11*b*.

The signal modulation apparatus 10 generates a second minimal reduction signal and converts the quantization signal (step S1008). More specifically, the minimal reducing unit 13*b* generates the second minimal reduction signal, and the return value generator 15 converts the quantization signal in a form to be subtracted in the adder 11*b*.

The signal modulation apparatus 10 generates a second added signal (step S1009). More specifically, the adder 11*b* generates the second added signal by subtracting the quantization signal returned by the quantizer 14 and the second minimal reduction signal generated by the minimal reducing unit 13*b*, from the new first integrated signal, and by adding the second integrated signal returned from the integrator 12*b* to the input signal.

The signal modulation apparatus 10 generates a second integrated signal (step S1010), and stores the second integrated signal therein (step S1011). More specifically, the integrator 12*b* generates a new second integrated signal by integrating the second added signal, and stores the generated new second integrated signal therein.

The signal modulation apparatus 10 generates a quantization signal (step S1012), outputs the quantization signal (step S1013), stores the quantization signal therein (step S1014), and waits again for the input signal (step S1001). More specifically, the quantizer 14 generates a new quantization signal by quantizing the new integrated signal generated by the integrator 12*b*, outputs the quantization signal to outside of the signal modulation apparatus 10, and stores the generated new quantization signal therein.

According to the first embodiment, it is possible to reduce the output noise generated by receiving the silent signal, because the integrated signal returned to the adder from the integrator is minimally reduced.

According to the first embodiment, it is also possible to reduce the output noise generated by receiving the silent signal in the secondary signal modulation apparatus. This is because the first integrated signal returned to the first adder from the first integrator is minimally reduced, and the second integrated signal returned to the second adder from the second integrator is minimally reduced.

According to the first embodiment, a user may arbitrarily set predetermined coefficients α and β that satisfy Formula (3) and Formula (4) at the same time. This is because the first integrated signal is minimally reduced, by multiplying a predetermined coefficient α that satisfies Formula (3) and Formula (4) at the same time by the first integrated signal, and the second integrated signal is minimally reduced, by multiplying a predetermined coefficient β that satisfies Formula (3) and Formula (4) at the same time by the second integrated signal.

In the first embodiment, the signal modulation apparatus 10 in which the invention is applied, and which modulates the input signal was explained. The signal modulation apparatus 10 according to the present invention can be mounted on electronic devices that modulates an analog signal to a digital signal, and a digital signal to an analog signal (for example, CODEC macro). In a second embodiment, when the signal modulation apparatus 10 according to the first embodiment is applied to the CODEC macro will be explained. The CODEC macro modulates the analog signal to the digital signal, and the digital signal to the analog signal. In the second embodiment, a configuration of the CODEC macro according to the second embodiment will be explained, followed by the advantages of the second embodiment.

Figure 4:
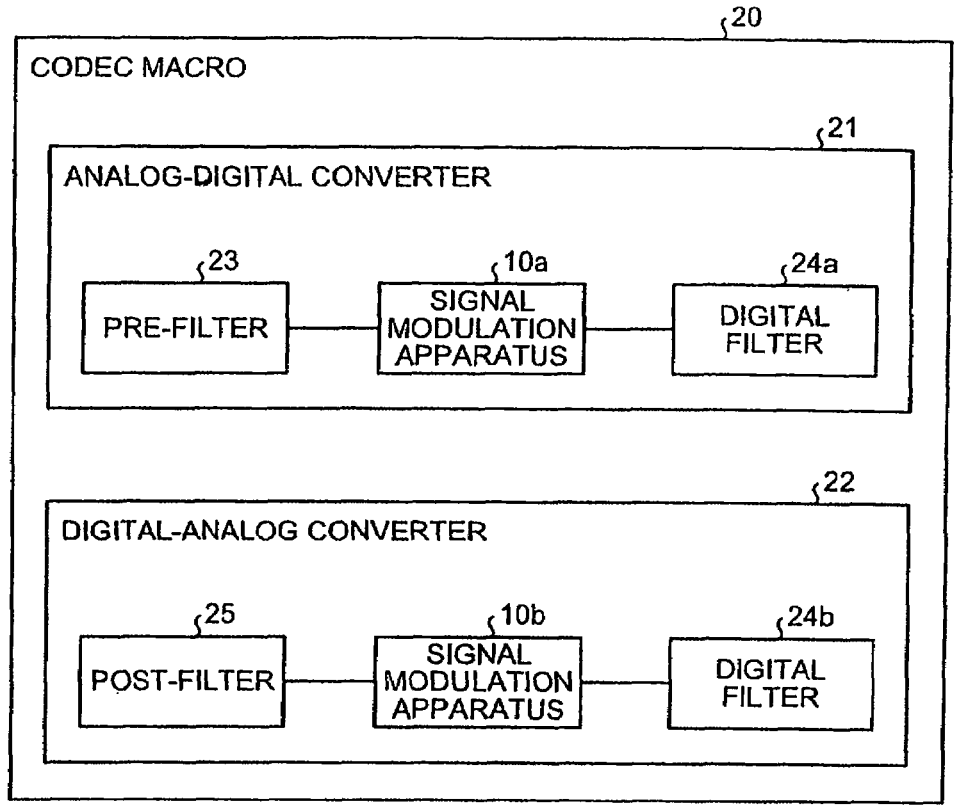
FIG. 4 is a block diagram of the configuration of a CODEC macro.

A configuration of a CODEC macro 20 according to a second embodiment will now be explained with reference to FIG. 4. FIG. 4 is a block diagram of the configuration of a CODEC macro.

As shown in FIG. 4, the CODEC macro 20 includes an analog-digital converter 21 and a digital-analog converter 22. The analog-digital converter 21 includes a pre-filter 23, a signal modulation apparatus 10*a*, and a digital filter 24*a* to convert an analog signal to a digital signal. It will be explained under the assumption that the pre-filter 23 and the signal modulation apparatus 10*a* execute each processing by hardware processing, and the digital filter 24*a* executes the processing by software processing that executes a predetermined algorithm on a computer.

The pre-filter 23 corresponds to a low-pass filter that removes a frequency band equal to or more than a predetermined frequency from the input signal, and anti-aliases the analog signal. In other words, the pre-filter 23 suppresses folded noise generated by the signal modulation apparatus 10*a*.

In other words, when an analog signal that includes a higher frequency signal than a Nyquist frequency (fs/2), which is a half of a sampling frequency (fs), is modulated into a digital signal by the signal modulation apparatus 10*a*, it is possible that the folded noise is included in the modulated digital signal. For example, when an analog signal of 1.1 megahertz is modulated into a digital signal, by the signal modulation apparatus 10*a* of which the sampling frequency is 2 megahertz and the Nyquist frequency is 1 megahertz, the analog signal is modulated into the digital signal of 0.9 megahertz. The digital signal of 0.9 megahertz is noise that is not included in the analog signal before being modulated, and is called folded noise. The pre-filter 23 suppresses the generation of such folded noise.

The signal modulation apparatus 10*a* modulates the analog signal to the digital signal. More specifically, the signal modulation apparatus 10*a* corresponds to the signal modulation apparatus 10 according to the first embodiment. The signal modulation apparatus 10*a* minimally reduces the integrated signal returned to the adders 11*a* and 11*b* from the integrators 12*a* and 12*b*, by the same process as that of the signal modulation apparatus 10 according to the first embodiment. Moreover, the signal modulation apparatus 10a modulates the analog signal anti-aliased by the pre-filter 23 to the digital signal.

The digital filter 24a down-samples the digital signal. More specifically, the digital filter 24a corresponds to a decimation filter, and reduces the sampling frequency of the digital signal modulated by the signal modulation apparatus 10a. The digital filter 24a is formed by a high-pass filter and a low-pass filter, and restricts the frequency band of the digital signal modulated by the signal modulation apparatus 10a.

The digital-analog converter 22 includes a post-filter 25, a signal modulation apparatus 10b, and a digital filter 24b, to modulate the digital signal to the analog signal. It will be explained under the assumption that the post-filter 25 executes the processing by the hardware processing, and the signal modulation apparatus 10b and the digital filter 24b execute each processing by the software processing that executes a predetermined algorithm on a computer.

The digital filter 24b up-samples the digital signal. More specifically, the digital filter 24b corresponds to an interpolation filter, and increases the sampling frequency of the digital signal input into the CODEC macro 20. The digital filter 24b is formed by a high-pass filter and a low-pass filter, and restricts the frequency band of the digital signal input into the CODEC macro 20.

The signal modulation apparatus 10b modulates the digital signal to the analog signal. More specifically, the signal modulation apparatus 10b corresponds to the signal modulation apparatus 10 according to the first embodiment. The signal modulation apparatus 10b minimally reduces the integrated signal returned to the adders 11a and 11b from the integrators 12a and 12b, by the process opposite to the signal modulation apparatus 10 according to the first embodiment. The signal modulation apparatus 10b also modulates the digital signal of which the frequency is increased by the digital filter 24b to the analog signal.

The post-filter 25 removes a component of the signal equal to or more than a predetermined frequency from the analog signal. More specifically, the post-filter 25 corresponds to the low-pass filter, and removes the noise equal to or more than a predetermined frequency generated by the digital-analog conversion by the signal modulation apparatus 10b, from the analog signal.

According to the second embodiment, it is possible to apply the invention to the CODEC macro that modulates the analog signal to the digital signal, and the digital signal to the analog signal. It is also possible to reduce the output noise generated when the silent analog signal and the silent digital signal are received.

According to the second embodiment, it is possible to apply the invention to the CODEC macro that includes the signal modulation apparatus that modulates the analog signal to the digital signal by hardware processing using an electric circuit, and the signal modulation apparatus that modulates the digital signal to the analog signal by software processing that executes a predetermined algorithm on a computer.

In the second embodiment, when the signal modulation apparatus 10 according to the present embodiment is applied to the CODEC macro 20 was explained. The CODEC macro 20 applied with the signal modulation apparatus 10 according to the present invention can be mounted on electronic devices such as audio equipment, communication equipment (audio CODEC), and measuring equipment that require highly accurate signal processing. In a third embodiment, when the CODEC macro according to the second embodiment is mounted on a mobile terminal will be explained. In the third embodiment, a configuration of the mobile terminal according to the third embodiment will be explained, followed by the advantages of the third embodiment.

Figure 5:
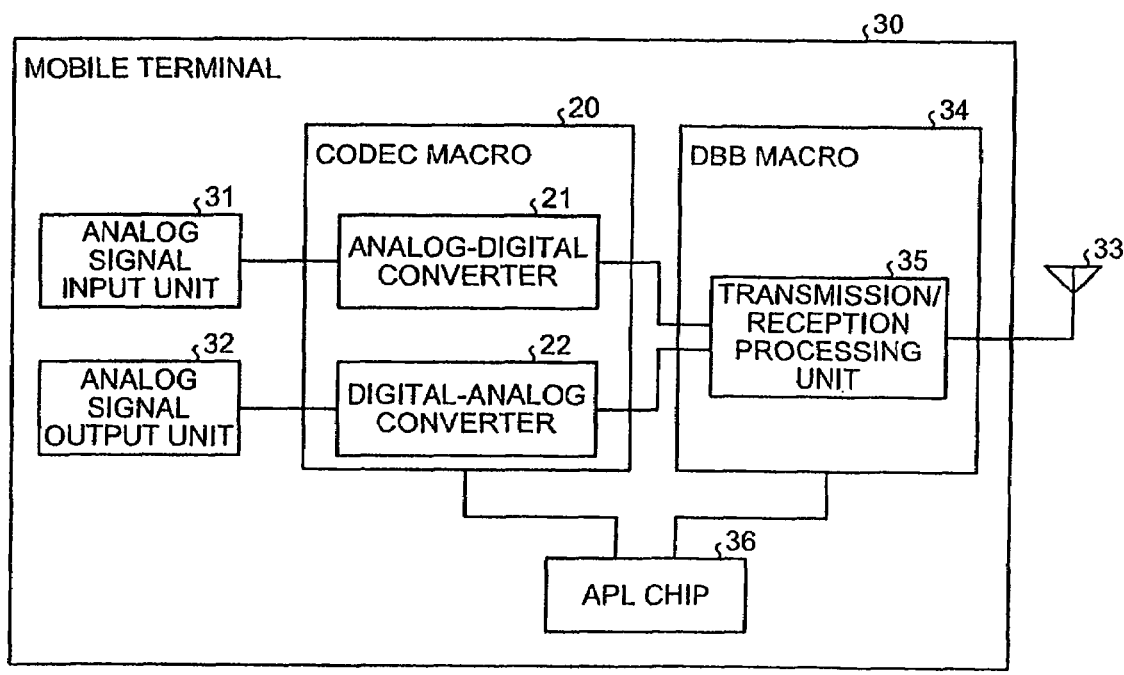
FIG. 5 is a block diagram of the configuration of a mobile terminal.

A configuration of a mobile terminal according to the third embodiment will now be explained with reference to FIG. 5. FIG. 5 is a block diagram of the configuration of the mobile terminal.

As shown in FIG. 5, a mobile terminal 30 includes the CODEC macro 20, an analog signal input unit 31, an analog signal output unit 32, an antenna 33, a digital base band (DBB) macro 34, and an application (APL) chip 36.

The CODEC macro 20 modulates the analog signal to the digital signal, and the digital signal to the analog signal. More specifically, the CODEC macro 20 corresponds to the CODEC macro 20 according to the second embodiment, modulates the analog signal to the digital signal by the analog-digital converter 21, and modulates the digital signal to the analog signal by the digital-analog converter 22.

The analog signal input unit 31 receives the analog signal from outside of the mobile terminal 30. More specifically, the analog signal input unit 31 corresponds to an analog terminal that receives the analog signal (such as sound-collecting microphone, headphone, hands-free device, and Bluetooth®), and for example, receives sound outputted by a user.

The analog signal output unit 32 outputs the analog signal to outside of the mobile terminal 30. More specifically, the analog signal output unit 32 corresponds to an analog terminal that outputs the analog signal (such as output speaker, headphone, hands-free device, and Bluetooth®), and for example, outputs sound to the user.

The antenna 33 transmits and receives a signal. More specifically, the antenna 33 transmits a wireless signal to a base station from the mobile terminal 30, and receives the wireless signal transmitted to the mobile terminal 30 from the base station.

The DBB macro 34 executes communication processing of various information. More specifically, a transmission/reception processing unit 35 of the DBB macro 34 transmits and processes a wireless signal that includes various digital transmission data (such as a wireless signal that includes audio data and a wireless signal that includes information data received from the CODEC macro 20) via the antenna 33. The transmission/reception processing unit 35 of the DBB macro 34 also separates reception data included in the wireless signal received via the antenna 33 to various digital reception data, and transfers to each macro (including macro not shown) provided in the mobile terminal 30. For example, when the wireless signal that includes audio data is received via the antenna 33, the transmission/reception processing unit 35 of the DBB macro 34 transfers the digital signal that includes the audio data to the CODEC macro 20.

The APL chip 36 controls each macro (including macro not shown) provided in the mobile terminal 30. More specifically, the APL chip 36 corresponds to a central processing unit (CPU) that executes various applications. The APL chip 36 controls the process of modulating the analog signal to the digital signal and modulating the digital signal to the analog signal by the CODEC macro 20, and controls the communication processing of various information by the DBB macro 34.

According to the third embodiment, it is possible to mount the CODEC macro 20 according to the second embodiment on the mobile terminal 30, and it is also possible to reduce the output noise during silence period.

The first to the third embodiments have been explained, but the present invention may be applied to various modifications other than the embodiments described above. Other embodiments will be explained below as a fourth embodiment.

For example, in the first embodiment, it was explained that "α" and "β" are 2 to the minus 16th power. The "α" and the "β" are coefficients multiplied by the integrated signal returned to the adders 11a and 11b from the integrators 12a and 12b by the minimal reducing units 13a and 13b. However, the present invention is not limited to this, and the present invention can be applied when the first coefficient α and the second coefficient β satisfy Formula (3) and Formula (4) at the same time. For example, α may be 2 to the minus 16th power, and β may be zero (0).

In the first embodiment, it was explained that the minimal reduction signal that minimally reduces the integrated signal is generated, by multiplying a predetermined coefficient by the integrated signal, returned to the adders 11a and 11b from the integrators 12a and 12b, by the minimal reducing units 13a and 13b. However, the present invention is not limited to this, and the present invention may be applied when the minimal reduction signal that minimally reduces the integrated signal is generated. For example, a minimal reduction signal with the same code (for example, a certain level signal at about a least significant bit (LSB) of the bit width of the adder in a digital circuit configuration) may be generated, by determining the code of information included in the integrated signal.

In the first embodiment, when the present invention is applied to the secondary signal modulation apparatus 10 was explained. However, the present invention is not limited to this. For example, even with the signal modulation apparatus 10 of n-order, or with the signal modulation apparatus that improves quality of actual sound by adding a random signal made of short bits to the input signal, the present invention can be applied by changing the coefficient multiplied by the integrated signal.

In the second embodiment, it was explained that the pre-filter 23, the signal modulation apparatus 10a, and the post-filter 25 execute each processing by the hardware processing, and the signal modulation apparatus 10b and the digital filters 24a and 24b execute the processing by the software processing that executes a predetermined algorithm on a computer. However, the present invention is not limited to this, and for example, all the processing may be executed by the hardware processing or all the processing may be executed by the software processing.

The processing procedures, the control procedures, specific names, and various data shown in the specification or in the drawings explained in the present embodiments can be optionally changed, unless otherwise specified.

The respective constituents of the respective apparatuses shown in FIGS. 2, 4, and 5 are functionally conceptual, and need not be physically configured as illustrated. In other words, the specific mode of dispersion and integration of each apparatus is not limited to the illustrations, and all or a part thereof can be functionally or physically dispersed or integrated in an optional unit, depending on various loads and the status of use.

For example, in FIG. 2, the integrator 12a is configured to return the previously self-generated and stored first integrated signal to the adder 11a and the minimal reducing unit 13a. However, the integrator 12a may be configured, so as to convert the first integrated signal with respect to the adder 11a, by returning the first integrated signal to the minimal reducing unit 13a, and by having the minimal reducing unit 13a to minimally reduce the first integrated signal. Moreover, in FIG. 4, the signal modulation apparatus 10a and the digital filter 24a may be integrated, and in FIG. 5, the CODEC macro 20 and the APL chip 36 may be integrated.

All or an optional part of each processing function carried out in each apparatus may be realized by the CPU, a micro controller unit (MCU), a micro processing unit (MPU), and a program analyzed and executed by the CPU, the MCU, and the MPU, or may be realized as hardware by wired logic.

The signal modulation method explained in the present embodiment may be realized by executing a program prepared in advance on a computer such as a personal computer and a work station.

Figure 6:
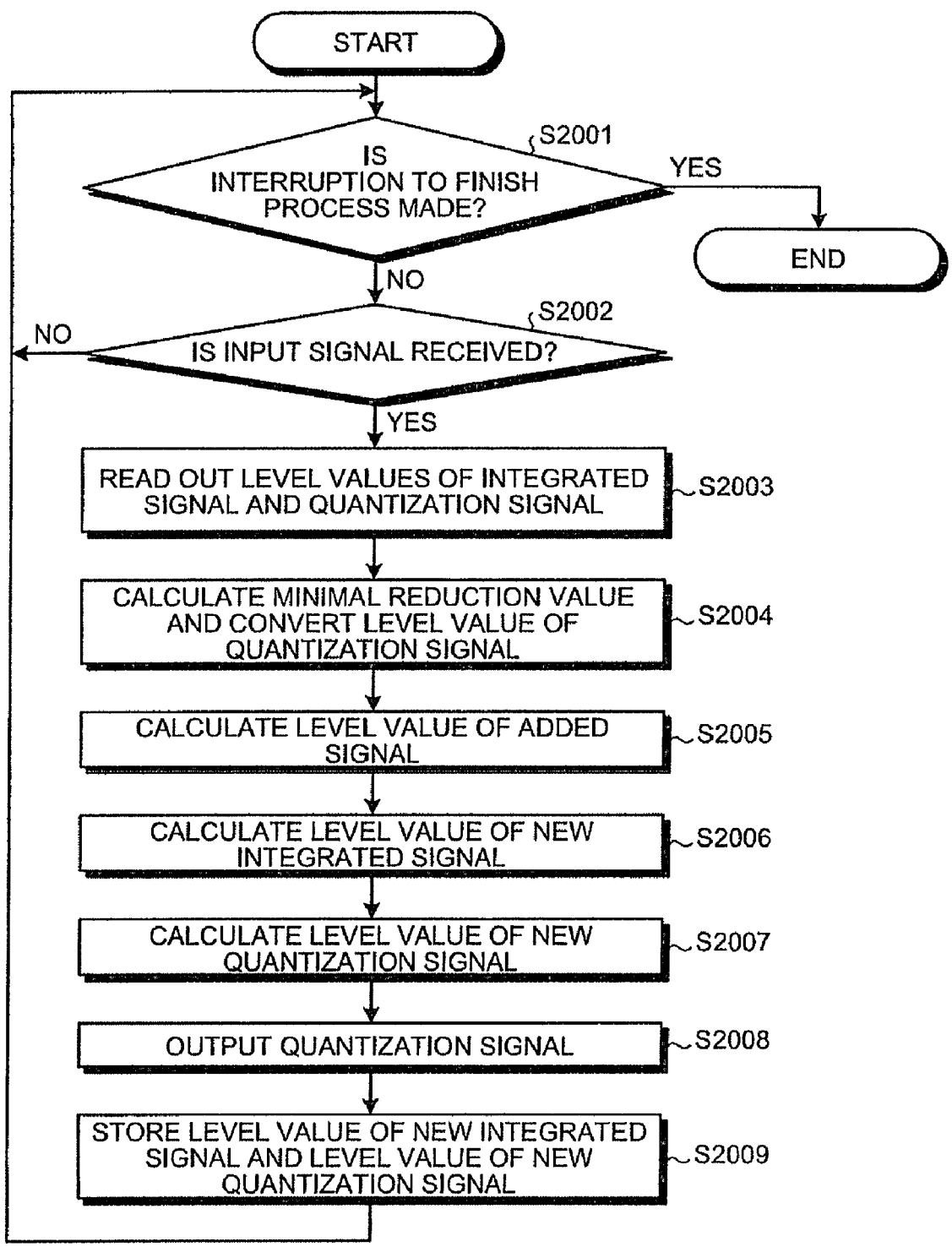
FIG. 6 is a flowchart of a processing flow executed by a computer as the signal modulation apparatus using a signal modulation program.

A signal modulation program that allows a computer to execute the signal modulation method that modulates the input signal to the quantization signal will now be explained with reference to FIG. 6. The computer as the signal modulation apparatus includes the adder that generates the added signal, the integrator that integrates the added signal, the quantizer that quantizes the integrated signal, and the minimal reducing unit that minimally reduces the integrated signal returned to the adder from the integrator. FIG. 6 is a flowchart of a processing flow executed by the computer as the signal modulation apparatus using the signal modulation program.

As shown in FIG. 6, the computer as the signal modulation apparatus determines whether an interruption to finish the process is made, when the signal modulation program is activated (step S2001).

When it is determined that an interruption to finish the process is not made (No at step S2001), the computer as the signal modulation apparatus determines whether an input signal is received (step S2002).

When it is determined that the input signal is not received (No at step S2002), the computer as the signal modulation apparatus determines whether an interruption to finish the process is made (step S2001).

On determining that the input signal is received (Yes at step S2002), the computer as the signal modulation apparatus reads out the level value of the integrated signal previously generated by the integrator from a predetermined storage unit, and reads out the level value of the quantization signal previously generated by the quantizer from a predetermined storage unit (step S2003). When the process of reading out the level values of the integrated signal and the quantization signal from a predetermined storage unit is executed for the first time, initial values (such as zero) of the integrated signal and the quantization signal set by a user will be read out from a predetermined storage unit.

The computer as the signal modulation apparatus calculates a minimal reduction value that minimally reduces the level value of the integrated signal, and converts the level value of the quantization signal in the level value to be subtracted by the adder (step S2004).

The computer as the signal modulation apparatus calculates the level value of the added signal by subtracting the minimal reduction value and the level value of the converted quantization signal from the level value of the input signal, and by adding the level value of the integrated signal to the level value of the input signal (step S2005).

The computer as the signal modulation apparatus calculates the level value of the new integrated signal from the level value of the added signal (step S2006), and calculates the level value of the new quantization signal from the level value of the new integrated signal (step S2007).

The computer as the signal modulation apparatus outputs the quantization signal based on the level value of the calculated new quantization signal (step S2008), and stores the level value of the calculated new integrated signal and the level value of the new quantization signal in a predetermined storage unit (step S2009).

The computer as the signal modulation apparatus again determines whether an interruption to finish the process is made (step S2001), and repeatedly executes the processes (steps S2001 to S2009), until an interruption to finish the process is made (Yes at step S2001).

The signal modulation program can be distributed via a network such as the Internet. The signal modulation program may be stored in computer-readable storage media such as hard disk, flexible disk (FD), compact disk read-only memory (CD-ROM), magneto optical disk (MO), and digital versatile disk (DVD), and may be executed by being read out from the storage medium by a computer.

According to an embodiment of the present invention, the output noise generated by receiving the silent signal can be reduced.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A signal modulation method by an electronic device including a quantizer, an integrator, and an adder, the method comprising:
   generating an added signal with the adder by subtracting a quantization signal returned by the quantizer from an input signal and by adding an integrated signal returned by the integrator to the input signal;
   generating a new integrated signal with the integrator by returning a previously self-generated and stored integrated signal to the adder and by integrating the added signal generated by the adder;
   generating a new quantization signal with a quantizer by quantizing the new integrated signal generated by the integrator; and
   minimally reducing the integrated signal returned to the adder from the integrator.

2. The signal modulation method according to claim 1, wherein the adder includes a first adder and a second adder, and the integrator includes a first integrator and a second integrator,
   the method further comprising:
   generating a first added signal by subtracting the quantization signal returned by the quantizer from the input signal and by adding a first integrated signal returned from the first integrator to the input signal;
   generating and storing a new first integrated signal with the first integrator by returning a previously self-generated and stored first integrated signal to the first adder and by integrating the added signal generated by the first adder;
   generating a second added signal by subtracting the quantization signal returned by the quantizer from the new first integrated signal and by adding a second integrated signal returned from the second integrator to the first integrated signal;
   generating and storing a new second integrated signal with the second integrator by returning a previously self-generated and stored second integrated signal to the second adder and by integrating the added signal generated by the second adder;
   generating a new quantization signal with the quantizer by quantizing the new integrated signal generated by the second integrator;
   minimally reducing the first integrated signal returned to the first adder from the first integrator; and
   minimally reducing the second integrated signal returned to the second adder from the second integrator.

3. The signal modulation method according to claim 2, wherein
   the minimally reducing the first integrated signal includes minimally reducing the first integrated signal by multiplying a predetermined coefficient $\alpha$ by the first integrated signal, and
   the minimally reducing the second integrated signal includes minimally reducing the second integrated signal by multiplying a predetermined coefficient $\beta$ by the second integrated signal, where $\alpha+\beta \approx 0$ and $\alpha-\beta+\alpha\beta \approx 0$.

4. The signal modulation method according to claim 1, wherein the electronic device includes a first signal modulation apparatus that modulates an analog signal to a digital signal, and a second signal modulation apparatus that modulates a digital signal to an analog signal, the method comprising:
   causing the first signal modulation apparatus to execute the minimal reduction by any one of or both hardware processing using an electric circuit and software processing that executes a predetermined algorithm on a computer; and
   causing the second signal modulation apparatus to execute the minimal reduction by any one of or both hardware processing using an electric circuit and software processing that executes a predetermined algorithm on the computer.

5. A signal modulation apparatus that modulates an input signal to a quantization signal, the signal modulation apparatus comprising:
   a quantizer;
   an integrator;
   an adder that generates an added signal by subtracting the quantization signal returned by the quantizer from the input signal, and by adding an integrated signal returned by the integrator to the input signal; and
   a minimal reducing unit,
   wherein the integrator returns a previously self-generated and stored integrated signal to the adder, generates a new integrated signal by integrating the added signal generated by the adder, and stores therein the new integrated signal generated,
   the quantizer returns a previously self-generated quantization signal to the adder, and generates a new quantization signal by quantizing the new integrated signal generated by the integrator, and
   the minimal reducing unit minimally reduces the integrated signal returned to the adder from the integrator.

6. An electronic device that modulates an input signal to a quantization signal, the electronic device comprising:
   a quantizer;
   an integrator;
   an adder that generates an added signal by subtracting the quantization signal returned by the quantizer from the input signal, and by adding an integrated signal returned by the integrator to the input signal; and
   a minimal reducing unit,
   wherein the integrator returns a previously self-generated and stored integrated signal to the adder, generates a new integrated signal by integrating the added signal generated by the adder, and stores therein the new integrated signal generated, the quantizer returns a previously self-generated quantization signal to the adder, and generates a new quantization signal by quantizing the new integrated signal generated by the integrator, and the minimal reducing unit minimally reduces the integrated signal returned to the adder from the integrator.

7. The electronic device according to claim 6, wherein the adder includes a first adder and a second adder, the integrator includes a first integrator and a second integrator, and the minimal reducing unit includes a first minimal reducing unit and a second minimal reducing unit, wherein the first adder generates a first added signal by subtracting the quantization signal returned by the quantizer from the input signal, and by adding a first integrated signal returned from the first integrator to the input signal, the first integrator returns a previously self-generated and stored first integrated signal to the first adder, generates a new first integrated signal by integrating the first added signal generated by the first adder, and stores therein the new first integrated signal thus generated, the second adder generates a second added signal by subtracting the quantization signal returned by the quantizer from the new first integrated signal generated by the first integrator, and by adding a second integrated signal returned from a second integrator to the new first integrated signal generated, the second integrator returns a previously self-generated and stored second integrated signal to the second adder, generates a new second integrated signal by integrating the second added signal generated by the second adder, and stores therein the new second integrated signal generated, the quantizer returns a previously self-generated quantization signal to the first adder and the second adder, and generates a new quantization signal by quantizing the new second integrated signal generated by the second integrator, the first minimal reducing unit minimally reduces the first integrated signal returned to the first adder from the first integrator, and the second minimal reducing unit minimally reduces the second integrated signal returned to the second adder from the second integrator.

8. The electronic device according to claim 7, wherein the first minimal reducing unit minimally reduces the first integrated signal by multiplying a predetermined coefficient $\alpha$ by the first integrated signal, and the second minimal reducing unit minimally reduces the second integrated signal by multiplying a predetermined coefficient $\beta$ by the first integrated signal, where $\alpha+\beta \cong 0$ and $\alpha-\beta+\alpha\beta \cong 0$.

* * * * *